(12) United States Patent
Takeda et al.

(10) Patent No.: US 8,922,053 B2
(45) Date of Patent: Dec. 30, 2014

(54) SEMICONDUCTOR CHIP AND SEMICONDUCTOR DEVICE INCLUDING THE SAME

(75) Inventors: Hiromasa Takeda, Tokyo (JP); Hiroki Fujisawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 286 days.

(21) Appl. No.: 13/278,755

(22) Filed: Oct. 21, 2011

(65) Prior Publication Data

US 2012/0112540 A1   May 10, 2012

(30) Foreign Application Priority Data

Nov. 4, 2010 (JP) ................. 2010-247352

(51) Int. Cl.
  *H02J 3/38* (2006.01)
  *G11C 7/10* (2006.01)
  *H01L 23/528* (2006.01)
  *H01L 23/00* (2006.01)
  *H01L 23/498* (2006.01)

(52) U.S. Cl.
  CPC ........... *H01L 24/14* (2013.01); *H01L 23/49838* (2013.01); *H01L 2924/01013* (2013.01); *G11C 7/1057* (2013.01); *H01L 23/5286* (2013.01); *H01L 2924/01082* (2013.01); *H01L 2924/014* (2013.01); *H01L 2924/01033* (2013.01); *H01L 2224/16225* (2013.01); *H01L 2924/01023* (2013.01); *H01L 2924/15311* (2013.01); *H01L 2224/1412* (2013.01)
  USPC ................. 307/18; 307/149; 307/43; 307/82; 307/80; 327/333; 327/565; 365/226; 365/193; 365/191; 365/189.09

(58) Field of Classification Search
  USPC ........ 307/18; 361/790, 302, 313; 365/189.09, 365/189.11, 191; 257/697; 327/565, 333; 363/62, 65, 49
  See application file for complete search history.

(56) References Cited

U.S. PATENT DOCUMENTS

| | | | | |
|---|---|---|---|---|
| 7,440,340 | B2 * | 10/2008 | Hwang et al. | 365/189.09 |
| 8,400,781 | B2 * | 3/2013 | Gillingham | 361/790 |
| 2007/0069362 | A1 * | 3/2007 | Isa et al. | 257/697 |
| 2008/0063092 | A1 * | 3/2008 | Takahashi | 375/257 |
| 2009/0289499 | A1 * | 11/2009 | Sato et al. | 307/18 |
| 2009/0323451 | A1 * | 12/2009 | Lee et al. | 365/226 |

FOREIGN PATENT DOCUMENTS

| | | |
|---|---|---|
| JP | 11-339480 | 12/1999 |
| JP | 2006-278805 | 10/2006 |
| JP | 2008-192651 | 8/2008 |
| JP | 2008-227387 | 9/2008 |
| JP | 2009-026861 | 2/2009 |
| JP | 2009-283673 A | 12/2009 |
| JP | 2010-219498 | 9/2010 |

* cited by examiner

*Primary Examiner* — Rexford Barnie
*Assistant Examiner* — Jagdeep Dhillon

(57) ABSTRACT

A semiconductor chip includes: a data output buffer that outputs a data signal; a first power-supply pad that supplies a first power-supply potential to the data output buffer; a power-supply wiring that is connected to the first power-supply pad; a strobe output buffer that outputs a strobe signal; and a second power-supply pad that supplies a second power-supply potential to the strobe output buffer. The power-supply wiring and the second power-supply pad are electrically independent of each other. Therefore, the power-supply noise associated with the switching of the data output buffer does not spread to the strobe output buffer. Thus, it is possible to improve the quality of the strobe signal.

15 Claims, 9 Drawing Sheets

SEMICONDUCTOR CHIP AND SEMICONDUCTOR DEVICE INCLUDING THE SAME

BACKGROUND OF THE INVENTION

1. Field of the Invention

The present invention relates to a semiconductor chip and a semiconductor device including the semiconductor chip, and particularly relates to a semiconductor chip in which a data output buffer and a strobe output buffer are provided to output a data signal and a strobe signal, respectively, and a semiconductor device including the semiconductor chip.

2. Description of Related Art

In a semiconductor chip having a high data transfer rate, such as DRAM (Dynamic Random Access Memory), when a data signal is output to outside in synchronization with a strobe signal that indicates an output timing of the data signal. The strobe signal enables a controller, which receives the data signal, to capture the data signal in synchronization with the strobe signal. Therefore, even when the data transfer rate is high, it is possible to accurately capture the data signal.

Because the data or strobe signal is output from a respective output buffer to the outside of the semiconductor chip, the output buffer employs a transistor having a high drive capability. Therefore, the output buffer can easily cause power-supply noise in association with switching. In order to prevent such power-supply noise from spreading to other internal circuits via power-supply wirings, a power-supply pad for the output buffer may be provided separately from power-supply pads for the other internal circuits (See Japanese Patent Application Laid-Open No. 2009-283673).

However, the power-supply noise associated with the switching of the output buffer can affect other output buffers. Particularly when the same power source is shared by a data output buffer, which outputs a data signal, and a strobe output buffer, which outputs a strobe signal, as shown in FIG. 12 of Japanese Patent Application Laid-Open No. 2009-283673, the power-supply noise, occurred in association with operation of the data output buffer, could spread to the strobe output buffer, possibly leading to a decline in the quality of the strobe signal.

Because the strobe signal is a reference signal that indicates a timing to capture data for the controller, the quality of the strobe signal is required to be higher than other signals. Accordingly, it is hoped that measures will be taken on a semiconductor chip and a circuit board on which the semiconductor chip is mounted in order to prevent the power-supply noise associated with the switching of the output buffer from spreading to the strobe output buffer.

SUMMARY

In one embodiment, there is provided a semiconductor chip that includes a semiconductor chip, wherein the semiconductor chip comprises: a data output buffer outputting a data signal; a first power-supply pad supplied with a first power-supply potential; a first wiring between the first power-supply pad and the output buffer; a strobe output buffer outputting a strobe signal for the data signal; a second power-supply pad provided independently of the first power-supply pad and supplied with a second power-supply potential; and a second wiring between the second power-supply pad and the strobe output buffer independently of the first wiring.

In another embodiment, there is provided a semiconductor device that includes a semiconductor chip, wherein the semiconductor chip comprises: a first surface and a second surface opposing to the first surface; a plurality of first pads arranged on the first surface on a first line extending in a first direction, the first pads including a plurality of first data pads, a strobe pad, and first and second power-supply pads; a plurality of first data output buffers each coupled to a corresponding one of the first data pads; a strobe output buffer coupled to the strobe pad; a first wiring extending from the first power-supply pad and reaching each of the first data output buffers; and a second wiring extending from the second power-supply pad and reaching the strobe output buffer, the second wiring being provided independently of the first wiring.

According to the present invention, the power-supply path of the data output buffer and the power-supply path of the strobe output buffer are electrically independent of one another. Therefore, the power-supply noise associated with the switching of the data output buffer does not spread to the strobe output buffer. Thus, it is possible to improve the quality of the strobe signal.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
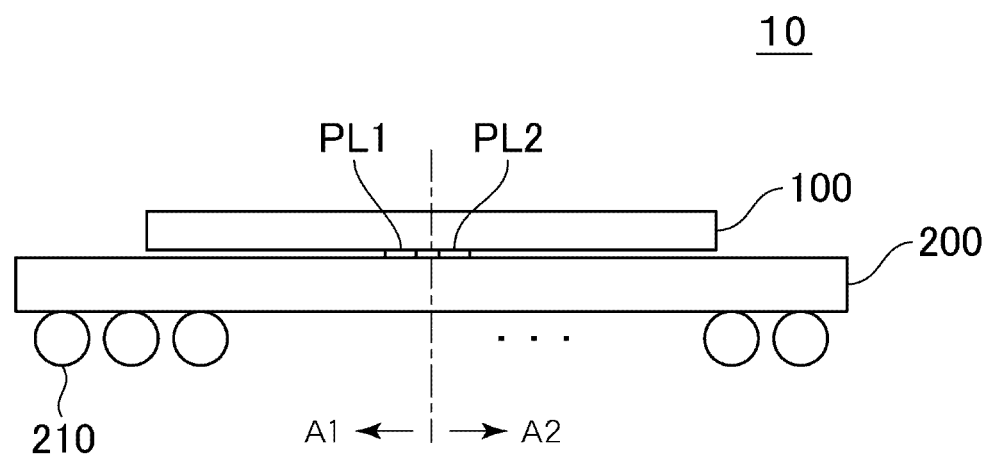
FIG. 1 is a cross-sectional diagram showing a configuration of a semiconductor device 10 according to a preferred embodiment of the present invention.

FIG. 1 is a cross-sectional diagram showing the configuration of the semiconductor device 10 according to a preferred embodiment of the present invention.

As shown in FIG. 1, the semiconductor device 10 of the present embodiment includes a semiconductor chip 100 and a circuit board 200, on which the semiconductor chip 100 is mounted. The type of the semiconductor chip 100 is not limited to a specific one. However, the present invention is applied to a semiconductor chip of a type that outputs a strobe signal that indicates an output timing of a data signal as in the case of a DRAM. According to the present embodiment, a DDR3 (Double Data Rate 3) DRAM is used as the semiconductor chip 100.

Figure 2:
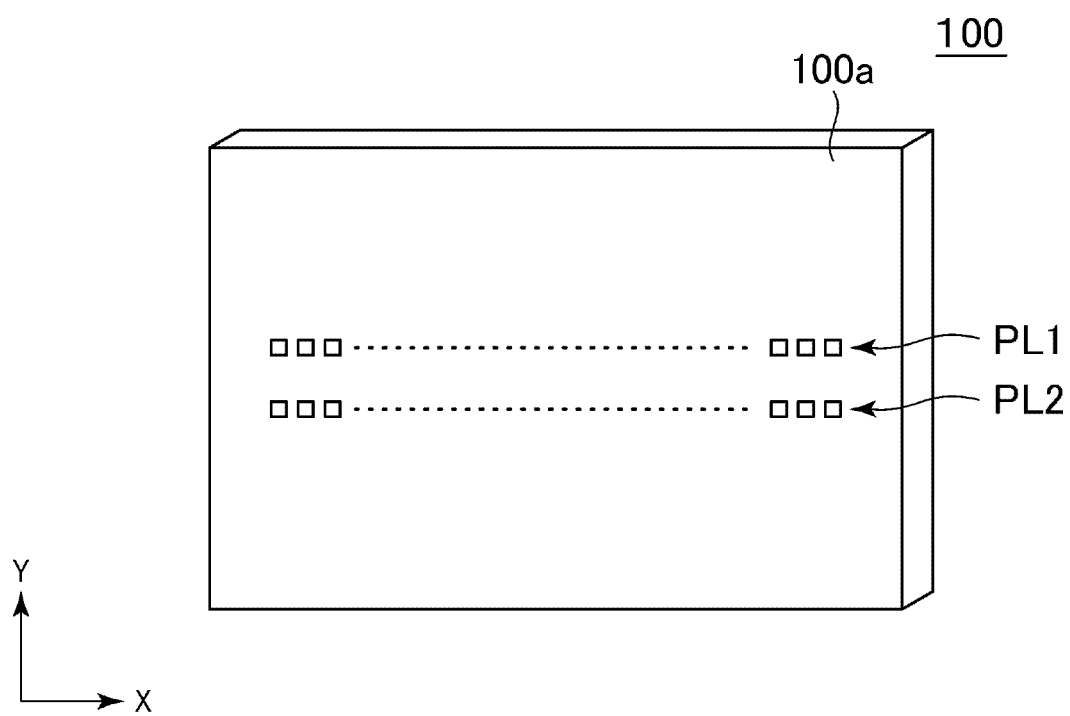
FIG. 2 is a schematic diagram illustrating how pad rows PL1 and PL2, which are provided on a semiconductor chip 100, are disposed.

Although not being limited to a specific one, two pad rows PL1 and PL2 are provided in a substantially central portion of a main surface 100a on the semiconductor chip 100 as shown in FIGS. 1 and 2. When the semiconductor chip 100 is connected to the circuit board 200 by means of flip-chip interconnection, pads included in the pad row PL1 needs to be connected to wirings provided in an area A1 side of the circuit board 200, and the other pads included in the pad row PL2 needs to be connected to wirings provided in an area A2 side of the circuit board 200. As a result, restrictions arise on the wirings on the circuit board 200. However, according to the present embodiment, the use of an internal power-supply wiring, described below, makes it possible to solve problems arising from the restrictions. The solution will be described later.

As shown in FIG. 2, the pad rows PL1 and PL2 each include a plurality of pads arranged in an X-direction. The pad rows PL1 and PL2 are disposed side by side in a Y-direction. The pads include power-supply pads, data pads, strobe pads, address pads, command pads and the likes. The description below focuses mainly on power-supply pads.

Figure 3:
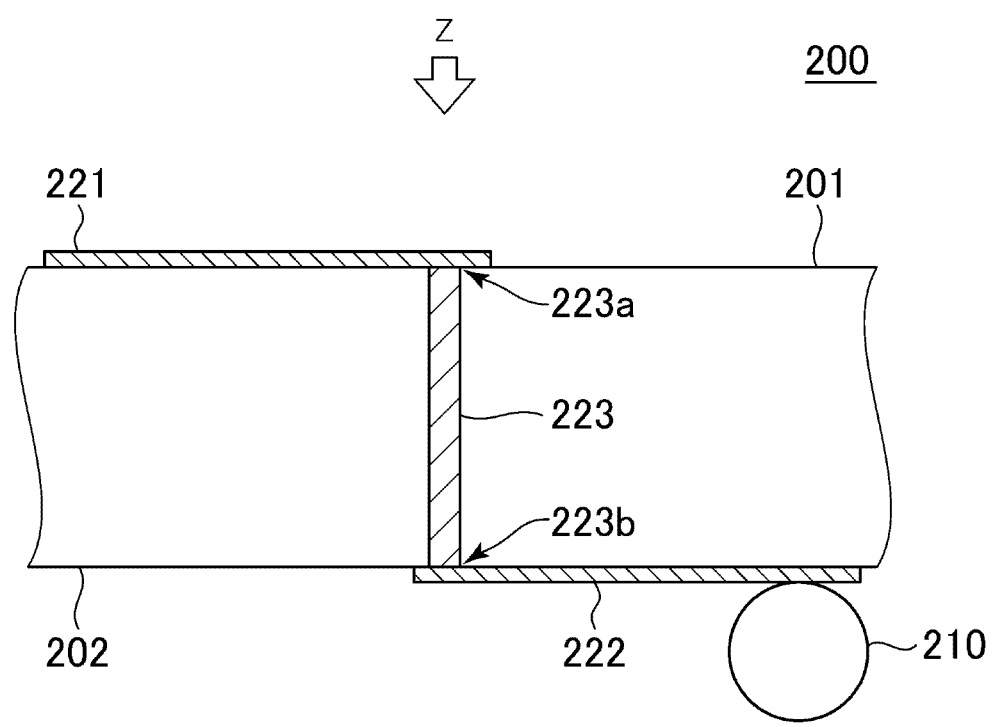
FIG. 3 is a partial cross-sectional view of a circuit board 200.

The circuit board 200 is a so-called single layered circuit board. That is, as shown in FIG. 3, the circuit board 200 includes two wiring layers: one of which is formed on a surface 201 on which the semiconductor chip 100 is mounted; and the other one is formed on a surface 202 on which a solder ball 210 is formed as an external terminal. These two wiring layers are electrically connected through a through-hole conductor penetrating through the circuit board 200. Besides the above wiring layers, there is no internal wiring layer. Therefore, it is possible to reduce costs compared with a multilayered circuit board containing internal wiring layers. However, in the single layered circuit board, routing of wirings using an internal wiring layer is impossible. Accordingly, a wiring connected to the pad row PL1 needs to be connected to a ball provided in the area A1 side. A wiring connected to the pad row PL2 needs to be connected to a ball provided in the area A2 side.

In this case, a "wiring layer" means a layer in which wirings extending in a planar direction of the circuit board are provided. Accordingly, a through-hole conductor, which provides a connection in a thickness direction of board, and the like are provided inside the board, but not wiring layers. As shown in FIG. 3, which is a partial cross-sectional view of the circuit board 200 showing a board wiring portion 221 and 222. The board wiring portion 221 is provided on the surface 201 of the circuit board 200. The board wiring portion 222 is provided on the surface 202 of the circuit board 200. The board wiring portions 221 and 222 are electrically connected via a through-hole conductor 223 penetrating through the circuit board 200. A one-end portion 223a, where the through-hole conductor 223 is in contact with the board wiring portion 221, and an other-end portion 223b, where the through-hole conductor 223 is in contact with the board wiring portion 222, are provided in the same location in planar view. In this case, the "planar view" means the thickness direction of the circuit board 200, i.e. the view seen in a direction of arrow Z shown in FIG. 3.

In FIG. 3, only one through-hole conductor 223 is shown. However, needless to say, a large number of through-hole conductors 223 are provided on the circuit board 200. One-end portions 223a of the through-hole conductors 223 and the corresponding other-end portions 223b are positioned in the same locations in planer view.

Figure 4:
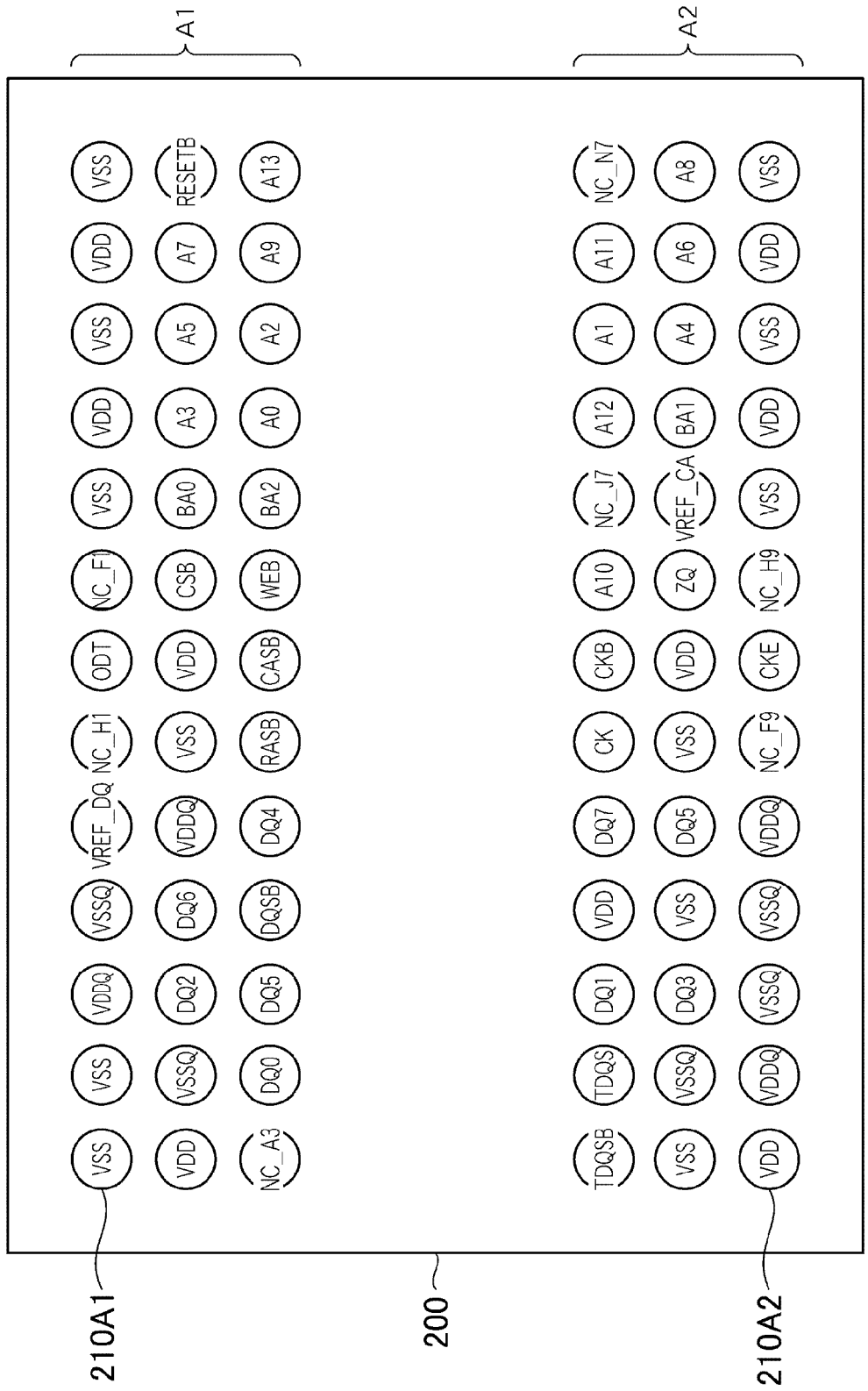
FIG. 4 is a schematic diagram illustrating a planar layout of balls 210 provided on the circuit board 200.

FIG. 4 is a schematic diagram illustrating a planar layout of balls 210 provided on the circuit board 200.

As shown in FIG. 4, the balls 210 that are provided on the circuit board 200 can be divided into two groups: a ball group 210A1, which is provided in the area A1, and a ball group 210A2, which is provided in the area A2. The balls that belong to the ball group 210A1 are connected to the pads belonging to the pad row PL1 of the semiconductor chip 100. The balls that belong to the ball group 210A2 are connected to the pads belonging to the pad row PL2 of the semiconductor chip 100. How the balls are connected to the pads has been already described. According to the present embodiment, a DDR3 DRAM is used as the semiconductor chip 100. Therefore, the balls are arranged in accordance with the DDR3 DRAM specification.

Figure 5:
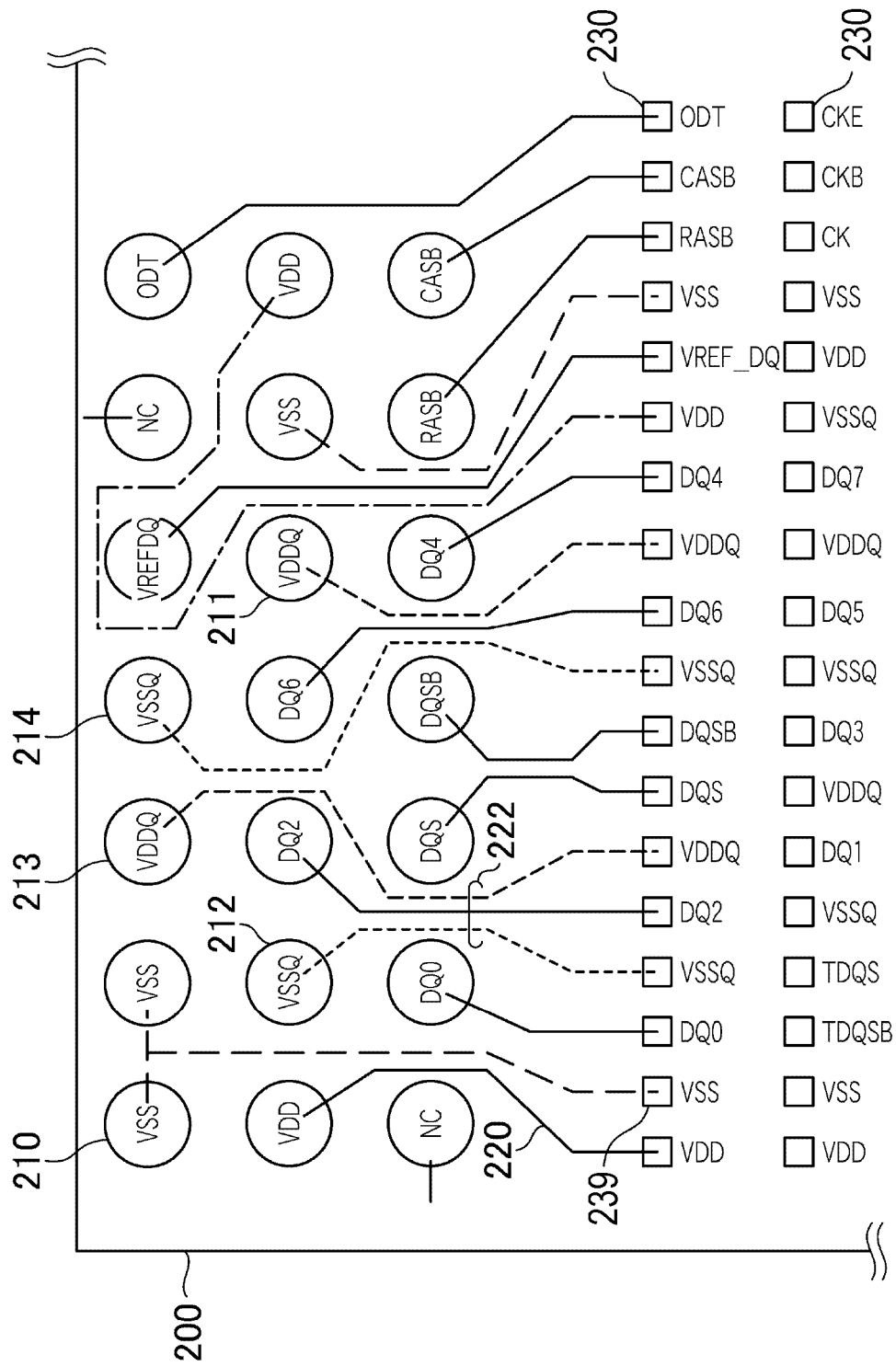
FIG. 5 is a schematic diagram showing part of board wirings provided on the circuit board 200.

FIG. 5 is a schematic diagram showing part of board wirings provided on the circuit board 200.

As shown in FIG. 5, in principle, each terminal 230 which are provided on the surface 202 is connected to an associated one of the balls 210 which are provided on the surface 201 through a board wiring 220 on the circuit board 200. However, some of power-supply terminals (power-supply terminal 239, for example) may make a common connection with a plurality of balls. As described above, the semiconductor chip 100 is mounted on one surface 201 of the circuit board 200, and each ball 210 is mounted on the other surface 202 of the circuit board 200. Therefore, the board wirings 220 shown in FIG. 5 each contain the board wiring portions 221 and 222 and the through-hole conductor 223 shown in FIG. 3. Moreover, the number of board wiring portions 222 that can be disposed between two adjacent balls is limited, for example, to three. The reason is that forming large numbers of board wiring portions 222 between adjacent balls would increase costs because microfabrication is required for the circuit board 200.

In FIG. 5, the balls 210 denoted by "VDD" and "VSS" supply power-supply potential VDD and ground potential VSS, respectively, to the semiconductor chip 100. The power-supply potential VDD and the ground potential VSS are used in the internal circuits except an output buffer of the semiconductor chip 100. The balls 210 denoted by "VDDQ" and "VSSQ" supply power-supply potential VDDQ and ground potential VSSQ, respectively, to the semiconductor chip 100. The power-supply potential VDDQ and the ground potential VSSQ are used in the output buffer of the semiconductor chip 100. Although not being limited to a specific one, the power-supply potentials VDDQ and VDD are at the same level. The power-supply potentials VDDQ and VDD are higher than the ground potentials VSSQ and VSS.

Two balls 210 denoted by "VDDQ", and two balls 210 denoted by "VSSQ" are shown in FIG. 5. These four balls are connected to different terminals 230 via different board wirings 220, respectively. Among the above balls, a ball 211 denoted by "VDDQ" and a ball 212 denoted by "VSSQ" supply operating voltage to a data output buffer. A ball 213 denoted by "VDDQ" and a ball 214 denoted by "VSSQ" supply operating voltage to a strobe output buffer. In this manner, a board wiring 220 that supplies operating voltage to the data output buffer and a board wiring 220 that supplies operating voltage to the strobe output buffer are not provided in common on the circuit board 200, and are insulated and separated from each other.

Other balls are for inputting and outputting a data signal or strobe signal, and for inputting a command signal, an address signal and the like. As shown in FIG. 5, the names of signals to be input or output are indicated on the respective balls. The names of signals to be input or output are also indicated on the respective pads.

Figure 6:
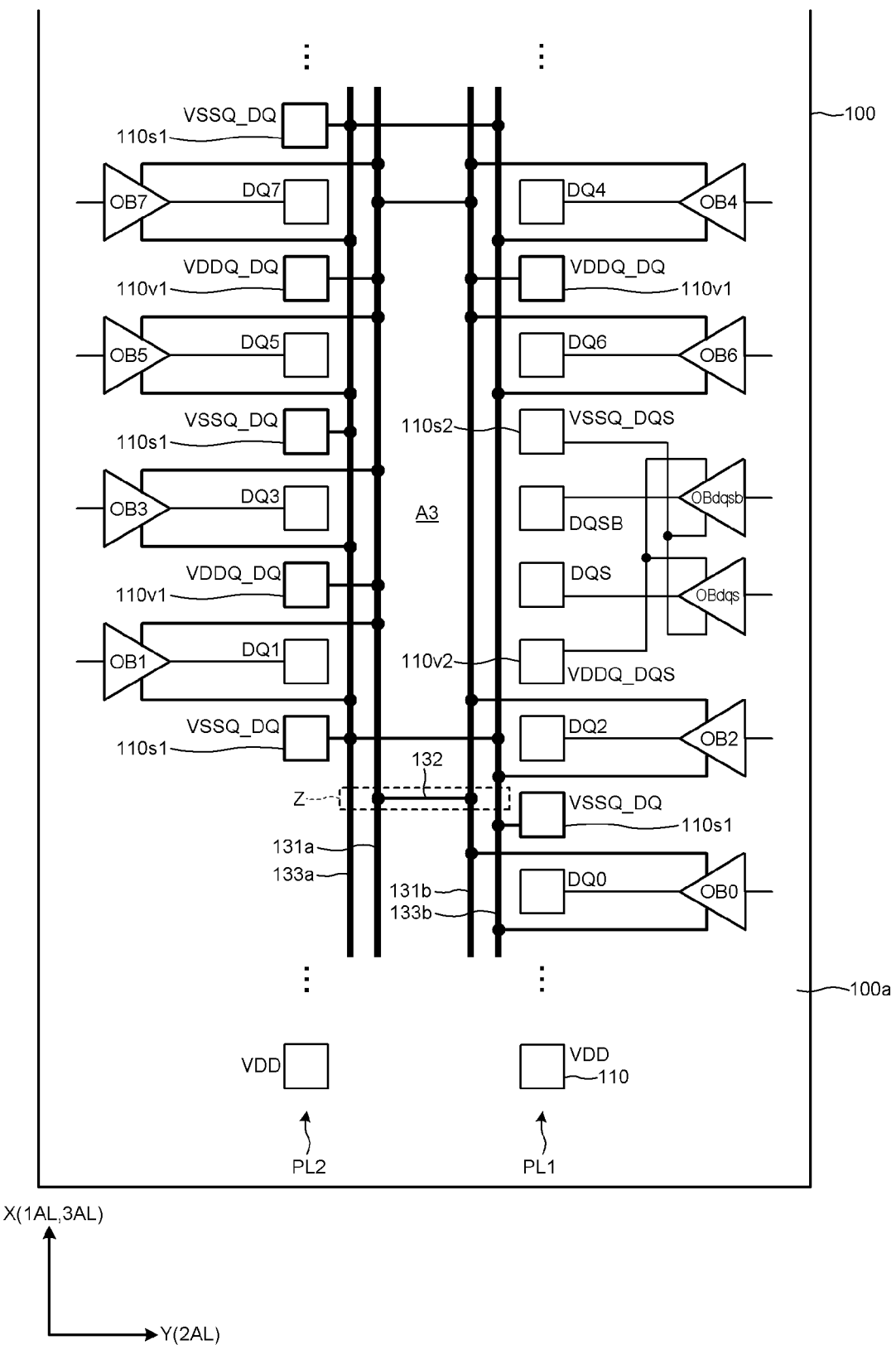
FIG. 6 is a schematic diagram illustrating a preferred layout of power-supply wirings in the semiconductor chip 100.

FIG. 6 is a schematic diagram illustrating a preferred layout of power-supply wirings in the semiconductor chip 100.

In the example shown in FIG. 6, a plurality of power-supply pads 110v1 and 110s1 are provided in the pad rows PL1 and PL2, respectively. In the pad row PL1, one power-supply pad 110v2 and two power-supply pads 110s2 (one of two power-supply pads 110s2 is shown in FIG. 6) are provided. As described above, the power-supply pads 110v1 and 110s1 are provided for the data output buffers OB0 to OBn−1, and the power-supply pads 110v2 and 110s2 are provided for the strobe output buffer OBdqs. Each of the pads 110 is coupled to a corresponding one of the terminals 230.

Each of plural power-supply pads 110v1 and 110s1 provided in the pad row PL2 makes a common connection with each other by means of power-supply wirings 131a or 133a, which extend in the X-direction along the pad row PL2. Similarly, each of plural power-supply pads 110v1 and 110s1 provided in the pad row PL1 makes a common connection with each other by means of power-supply wirings 131b or 133b, which extend in the X-direction along the pad row PL1. The power-supply wiring 131a or 133a that extends along the pad row PL2 and the power-supply wiring 131b or 133b that extends along the pad row PL1 are short-circuited by a power-supply wiring 132, which extends in the Y-direction in an area A3, which exists between the pad rows PL1 and PL2.

Therefore, a plurality of power-supply pads 110v1 provided in the pad row PL2 and a plurality of power-supply pads 110v1 provided in the pad row PL1 are short-circuited by a predetermined power-supply wiring 132. Similarly, a plurality of power-supply pads 110s1 provided in the pad row PL2 and a plurality of power-supply pads 110s1 provided in the pad row PL1 are short-circuited by another power-supply wiring 132. As a result, a power source for the data output buffers OB0 to OBn−1 becomes more stable. For example, even when the supply of power to a data output buffer disposed in the pad row PL1 is insufficient because of a small number of power-supply pads that can be disposed in the pad row PL1, power can be supplied from a power-supply pad disposed in the pad row PL2 via a power-supply wiring 132. Therefore, it is possible to supply enough power to each data output buffer.

Incidentally, the reason the number of power-supply pads that can be disposed in one pad row is insufficient is that, as described above, there is the following restriction: a pad that the pad row PL2 contains needs to be connected to a wiring provided in the area A1 side of the circuit board 200, and a pad that the pad row PL1 contains needs to be connected to a wiring provided in the area A2 of the circuit board 200. Moreover, when the number of wirings that can be disposed between two adjacent balls is limited, for example, to three, a great restriction arises in routing of a board wiring in the area A1 or A2, which can easily lead to a shortfall in the supply of power as described above. The problems are solved by short-circuiting the power-supply wiring 131a or 133a and the power-supply wiring 131b or 133b with the use of the power-supply wiring 132 extending in the Y-direction.

Although not being limited to a specific one, it is preferred that a first aluminum wiring layer (AL1) be used for the power-supply wiring 131, a second aluminum wiring layer (AL2) for the power-supply wiring 132, and a third aluminum wiring layer (AL3) for the power-supply wiring 133. The reason is that since an upper wiring layer has a larger cross-sectional area of a wiring and lower resistance, the power-supply wiring 132 that connects the power-supply wiring 131a or 133a and the power-supply wiring 131b or 133b is less effective when the bottom wiring layer AL1 is used for the power-supply wiring 132.

Similarly, the power-supply wirings connected between the power-supply pads 110v2 and 110s2 and the strobe output buffers OBdqs and OBdqsb are provided on the first and third aluminum wiring layers (AL1 and AL3) extending in the X-direction and also provided on the second aluminum wiring layer (AL2) extending in the Y-direction.

Figure 7:
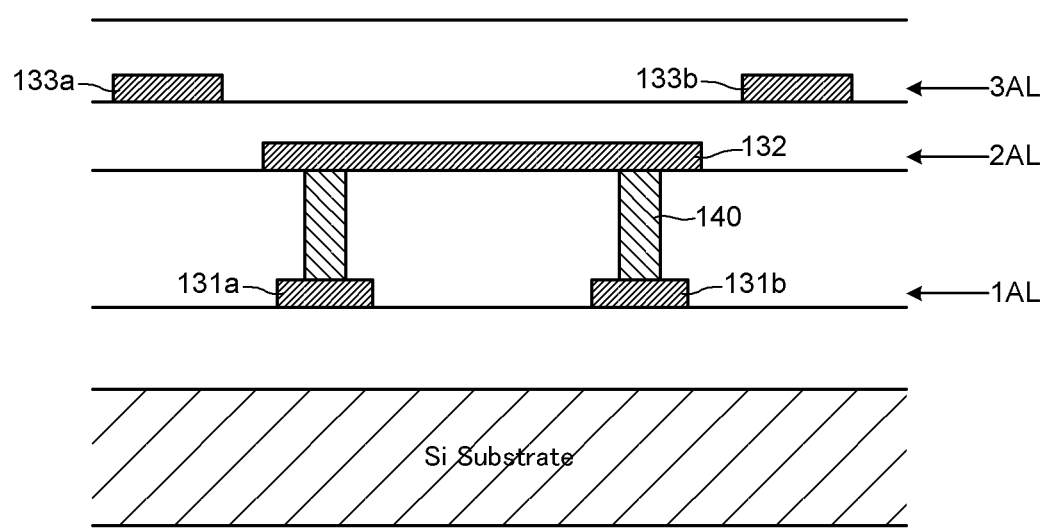
FIG. 7 shows a cross sectional view of the area Z shown in FIG. 6.

FIG. 7 shows a cross sectional view of the area Z shown in FIG. 6. The semiconductor chip 100 comprises a multi-level wiring structure including a first-level wiring layer (1AL), a second-level wiring layer (2AL), a third-level wiring layer (3AL), a first interlayer insulating film between the first-level and second-level wiring layers and a second interlayer insulating film between the second-level and the third-level wiring layers. Contact plug 140 connects two wirings each provided on respective one of different wiring layers.

Figure 8:
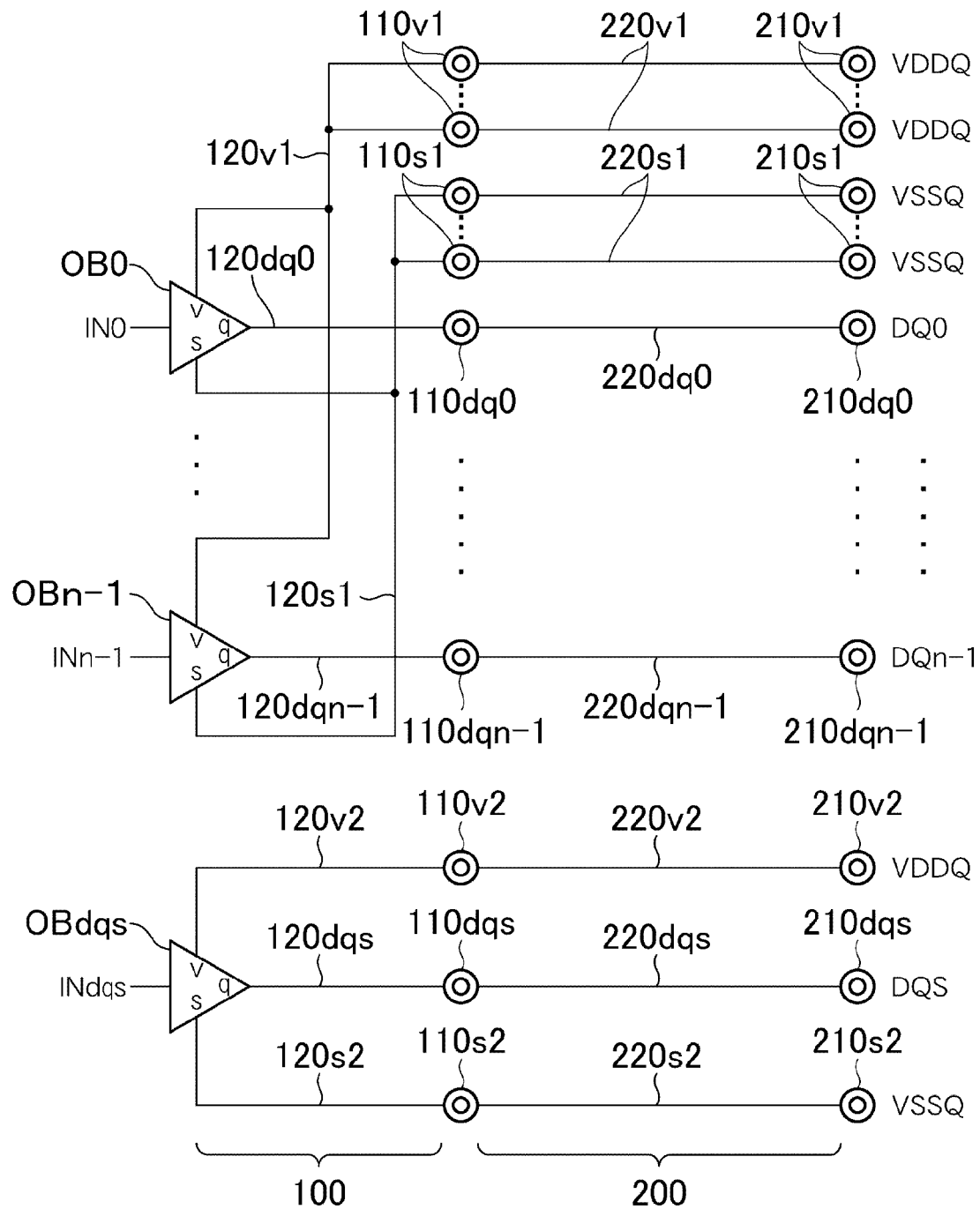
FIG. 8 is a circuit diagram showing a connection relationship between output buffers and balls.

FIG. 8 is a circuit diagram showing a connection relationship between output buffers and balls.

In FIG. 8, circuits or wirings shown in an area indicated by reference numeral 100 are circuits or wirings provided on the semiconductor chip 100. Wirings shown in an area indicated by reference numeral 200 are wirings provided on the circuit board 200.

Figure 9:
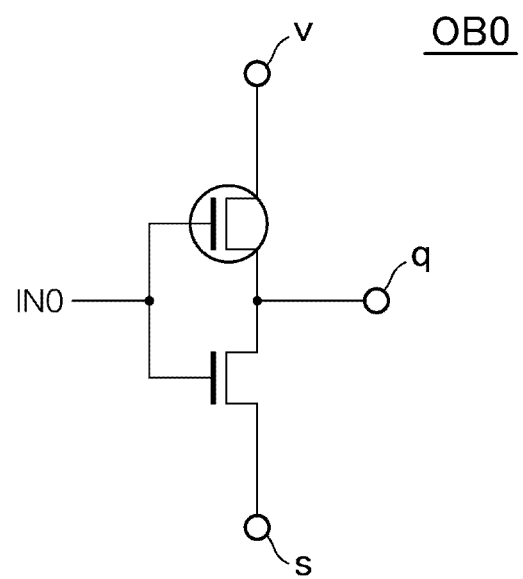
FIG. 9 is a diagram showing an equivalent circuit of an output buffer.

As shown in FIG. 8, on the semiconductor chip 100, n data output buffers OB0 to OBn−1 and a strobe output buffer OBdqs are provided. The output buffers OB0 to OBn−1 and OBdqs each include a power-supply node v of a high-potential-side and a power-supply node s of a low-potential-side. The output buffers OB0 to OBn−1 and OBdqs are operated by voltage applied between these power-supply nodes. As shown in FIG. 9, which is a diagram showing an equivalent circuit, the output buffer OB0 includes a P-channel MOS transistor and a N-channel MOS transistor, which are connected in series between the power-supply nodes v and s. According to the above configuration, on the basis of a logic level of an input signal IN0, either power-supply node v or power-supply node s is connected to an output node q, which is a connection point of the transistors. Therefore, a data signal DQ0 is output from the output node q. The other output buffers OB1 to OBn−1 and OBdqs have the same circuit configuration.

The output nodes q of the data output buffers OB0 to OBn−1 are connected to corresponding data pads 110dq0 to 110dqn−1 via corresponding data wirings 120dq0 to 120dqn−1 in the semiconductor chip 100. The data pads 110dq0 to 110dqn−1 are connected to corresponding balls 210dq0 to 210dqn−1 via board wirings 220dq0 to 220dqn−1 provided on the circuit board 200.

The output node q of the strobe output buffer OBdqs is connected to a strobe pad 110dqs via a strobe wiring 120dqs in the semiconductor chip 100. The strobe pad 110dqs is connected to a ball 210dqs via a board wiring 220dqs provided on the circuit board 200.

The power-supply nodes v of the data output buffers OB0 to OBn−1 are commonly connected to a plurality of power-supply pads 110v1 via power-supply wirings 120v1 in the semiconductor chip 100. The power-supply nodes s of the data output buffers OB0 to OBn−1 are commonly connected to a plurality of power-supply pads 110s1 via power-supply wirings 120s1 in the semiconductor chip 100. According to the present invention, it is not essential to provide a plurality of power-supply pads 110v1 and a plurality of power-supply pads 110s1. However, it is preferred that a plurality of power-supply pads 110v1 and a plurality of power-supply pads 110s1 be provided to supply enough power to the data output buffers OB0 to OBn−1. A plurality of power-supply pads 110v1 and 110s1 described above is short-circuited inside the semiconductor chip 100 as shown in FIG. 8 and connected to the power-supply nodes v and s, respectively, of the data output buffers OB0 to OBn−1.

The power-supply nodes v of the strobe output buffer OBdqs is connected to the power-supply pads 110v2 via power-supply wirings 120v2 in the semiconductor chip 100.

The power-supply nodes s of the strobe output buffer OBdqs is connected to the power-supply pads 110s2 via power-supply wirings 120s2 in the semiconductor chip 100. The power-supply wiring 120v2 and the power-supply wiring 120v1 are separated and insulated from each other in the semiconductor chip 100. Similarly, the power-supply wiring 120s2 and the power-supply wiring 120s1 are separated and insulated from each other in the semiconductor chip 100.

According to the above configuration, a power source for the data output buffers OB0 to OBn−1 and a power source for the strobe output buffer OBdqs are completely separated from each other in the semiconductor chip 100.

The power-supply pads are each connected to corresponding power-supply balls via board wirings provided on the circuit board 200. More specifically, the power-supply pads 110v1 and 110s1 for the data output buffers are connected to the corresponding power-supply balls 210v1 and 210s1, respectively, via the corresponding board wirings 220v1 and 220s1. The power-supply pads 110v2 and 110s2 for the strobe output buffer are connected to the corresponding power-supply balls 210v2 and 210s2, respectively, via the corresponding board wirings 220v2 and 220s2. The board wiring 220v2 and the board wirings 220v1 are separated and insulated from each other on the circuit board 200. Similarly, the board wiring 220s2 and the board wirings 220s1 are separated and insulated from each other on the circuit board 200.

According to the above configuration, a power source for the data output buffers OB0 to OBn−1 and a power source for the strobe output buffer OBdqs are completely separated from each other even on the circuit board 200.

Therefore, the power-supply noise, which occurs due to the operation of the data output buffers OB0 to OBn−1, does not spread to the strobe output buffer OBdqs, making it possible to improve the quality of the strobe signal DQS.

It is apparent that the present invention is not limited to the above embodiments, but may be modified and changed without departing from the scope and spirit of the invention.

What is claimed is:

1. A semiconductor device comprising a semiconductor chip comprising:
   a plurality of data output buffers outputting a data signal;
   a plurality of first power-supply pads supplied with a first power-supply potential;
   a first wiring connected between the first power-supply pads and the data output buffers in common;
   a strobe output buffer outputting a strobe signal for the data signal;
   a second power-supply pad provided independently of the first power-supply pads and supplied with a second power-supply potential; and
   a second wiring between the second power-supply pad and the strobe output buffer, the second wiring being electrically independent of the first wiring;
   wherein the first power-supply potential is substantially equal to the second power-supply potential.

2. The semiconductor device as claimed in claim 1, wherein the semiconductor chip further comprises:
   a third power-supply pad supplied with a ground potential;
   a third wiring between the third power-supply pad and the output buffer;
   a fourth power-supply pad provided independently of the third power-supply pad and supplied with the ground potential; and
   a fourth wiring between the fourth power-supply pad and the strobe output buffer independently of the third wiring.

3. The semiconductor device as claimed in claim 1, further comprising a circuit board on which the semiconductor chip is mounted, wherein the circuit board includes:
   a first power-supply ball supplied with the first power-supply potential;
   a second power-supply ball provided independently of the first power-supply ball and supplied with the second power-supply potential;
   a first board wiring between the first power-supply ball and the first power-supply pads; and
   a second board wiring between the second power-supply ball and the second power-supply pad independently of the first board wiring.

4. The semiconductor device as claimed in claim 2, further comprising a circuit board on which the semiconductor chip is mounted, wherein the circuit board includes:
   a first power-supply ball supplied with the first power-supply potential;
   a second power-supply ball provided independently of the first power-supply ball and supplied with the second power-supply potential;
   a first board wiring between the first power-supply ball and the first power-supply pads;
   a second board wiring between the second power-supply ball and the second power-supply pad independently of the first board wiring;
   a third power-supply ball provided independently of the first and second power-supply balls and supplied with the ground potential;
   a third board wiring between the third power-supply ball and the third power-supply pad independently of the first and second board wirings;
   a fourth power-supply ball provided independently of the first to third power-supply balls and supplied with the ground potential; and
   a fourth board wiring between fourth power-supply ball and the fourth power-supply pad independently of the first to third board wirings.

5. A semiconductor device comprising a semiconductor chip comprising:
   a first surface and a second surface opposing to the first surface;
   a plurality of first pads arranged on the first surface on a first line extending in a first direction, the first pads including a plurality of first data pads, a strobe pad, and first and second power-supply pads;
   a plurality of first data output buffers each coupled to a corresponding one of the first data pads;
   a strobe output buffer coupled to the strobe pad;
   a first wiring extending from the first power-supply pad and reaching each of the first data output buffers; and
   a second wiring extending from the second power-supply pad and reaching the strobe output buffer, where the first and second wiring are not provided in common and are insulated and separated from each other.

6. The semiconductor device as claimed in claim 5, wherein the semiconductor chip further comprises:
   a plurality of second pads arranged on the first surface on a second line in that is substantially parallel to the first line, the second pads including a plurality of second data pads and a third power-supply pad provided independently of the first power-supply pad;
   a plurality of second data output buffers each coupled to a corresponding one of the second data pads;
   a third wiring extending from the third power-supply pad and reaching each of the second data output buffers; and a fourth wiring between the first wiring and the third wiring.

7. The semiconductor device as claimed in claim 6, wherein
the first pads further includes a forth power-supply pad and a fifth power-supply pad,
the second pads further including a sixth power-supply pad, and
the semiconductor chip further comprising:
a fifth wiring extending from the fourth power-supply pad and reaching each of the first data output buffers;
a sixth wiring extending from the sixth power-supply pad and reaching each of the second data output buffers;
a seventh wiring between the fifth and sixth wirings; and
an eighth wiring extending
from the fifth power-supply pad and reaching the strobe output buffer and provided independently of the fifth, sixth and seventh wirings.

8. The semiconductor device as claimed in claim 6, wherein the semiconductor chip comprises a multi-level wiring structure including a first-level wiring layer, a second-level wiring layer, a third-level wiring layer, a first interlayer insulating film between the first-level and second-level wiring layers and a second interlayer insulating film between the second-level and the third-level wiring layers, each of the first and third wirings including a first portion extending in the first direction and being formed as one of the first-level and third-level wiring layers, and the fourth wiring extending in a second direction crossing the first direction and being formed as the second-level wiring layer.

9. The semiconductor device as claimed in claim 8, wherein, the first portion and the fourth wiring are provided in an area that is between the first and second lines.

10. The semiconductor device as claimed in claim 7, wherein the semiconductor chip comprises a multi-level wiring structure including a first-level wiring layer, a second-level wiring layer, a third-level wiring layer, a first interlayer insulating film between the first-level and second-level wiring layers and a second interlayer insulating film between the second-level and the third-level wiring layers, each of the first and third wirings including a first portion extending in the first direction, each of the fifth and sixth wirings including a second portion extending in the first direction, one of the first-level and third-level wiring layers including the first portion, the other of the first-level and the third-level wiring layers including the second portion, and the second-level wiring layer including the fourth and seventh wirings.

11. The semiconductor device as claimed in claim 10, wherein, the first portion, the fourth wiring, the second portion and the seventh wiring are provided in an area between the first and second lines.

12. The semiconductor device as claimed in claim 6, further comprising a circuit board including a third surface and a fourth surface opposing to the third surface, the semiconductor chip being mounted on the third surface of the circuit board, wherein the circuit board comprises:
a plurality of balls provided on the fourth surface and including first, second and third power-supply balls; and
first, second and third board wirings between first, second and third power-supply pads and first, second and third power-supply balls, respectively, and provided independently of one another.

13. The semiconductor device as claimed in claim 5, wherein, the first and second power-supply pads are supplied with first and second power-supply potentials, respectively, and the first power-supply potential is substantially equal to the second power-supply potential.

14. The semiconductor device as claimed in claim 7, wherein, the first and third power-supply pads are supplied with a first power-supply potential, the second power-supply pad is supplied with a second power-supply potential, the fourth and sixth power-supply pads are supplied with a third power-supply potential, the fifth power-supply pad is supplied with a fourth power-supply potential, the first power-supply potential is substantially equal to the second power-supply potential, and the third power-supply potential is substantially equal to the fourth power-supply potential.

15. The semiconductor device as claimed in claim 14, wherein, the third and fourth power-supply potentials are a ground potential.

* * * * *